(12) United States Patent
Chen et al.

(10) Patent No.: US 8,368,173 B2
(45) Date of Patent: Feb. 5, 2013

(54) SEMICONDUCTOR PACKAGE AND METHOD FOR MAKING THE SAME

(75) Inventors: Chien-Hua Chen, Kaohsiung (TW); Teck-Chong Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 175 days.

(21) Appl. No.: 12/795,357

(22) Filed: Jun. 7, 2010

(65) Prior Publication Data

US 2011/0156204 A1   Jun. 30, 2011

(30) Foreign Application Priority Data

Dec. 31, 2009   (TW) .............................. 98146113 A

(51) Int. Cl.
*H01L 27/08* (2006.01)
(52) U.S. Cl. ........ 257/531; 257/277; 257/303; 257/306; 257/774; 257/E25.029
(58) Field of Classification Search .................. 257/277, 257/303, 306, 531, 774, E25.029
See application file for complete search history.

(56) References Cited

U.S. PATENT DOCUMENTS 5,915,188 A * 6/1999 Ramakrishnan et al. ..... 438/381
2006/0197183 A1* 9/2006 Yang et al. ..................... 257/532
2007/0148825 A1* 6/2007 Kikuta et al. .................. 438/118
2010/0065942 A1* 3/2010 Lin et al. ........................ 257/531

OTHER PUBLICATIONS

Office Action issued on Nov. 23, 2012 by the Intellectual Property Office of R.O.C.(TIPO) and Summary of Office Action for Taiwan Application No. 098146113, 7 pages.

* cited by examiner

*Primary Examiner* — Tan N Tran
(74) *Attorney, Agent, or Firm* — McCracken & Frank LLC

(57) ABSTRACT

The present invention relates to a semiconductor package and a method for making the same. The semiconductor package includes a base material, a first metal layer, a first dielectric layer, a first upper electrode and a first protective layer. The first metal layer is disposed on a first surface of the base material, and includes a first inductor and a first lower electrode. The first dielectric layer is disposed on the first lower electrode. The first upper electrode is disposed on the first dielectric layer, and the first upper electrode, the first dielectric layer and the first lower electrode form a first capacitor. The first protective layer encapsulates the first inductor and the first capacitor. Whereby, the first inductor and the first lower electrode of the first capacitor are disposed on the same layer, so that the thickness of the product is reduced.

8 Claims, 17 Drawing Sheets

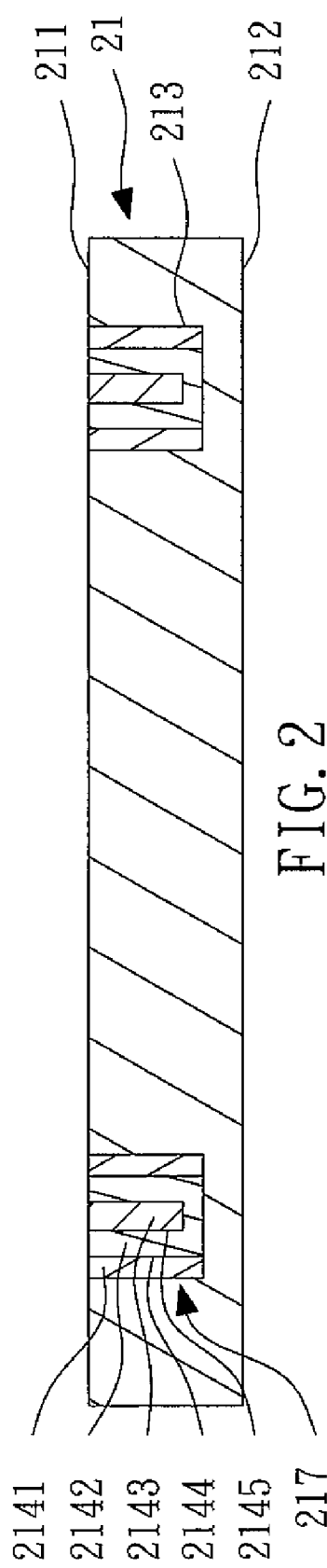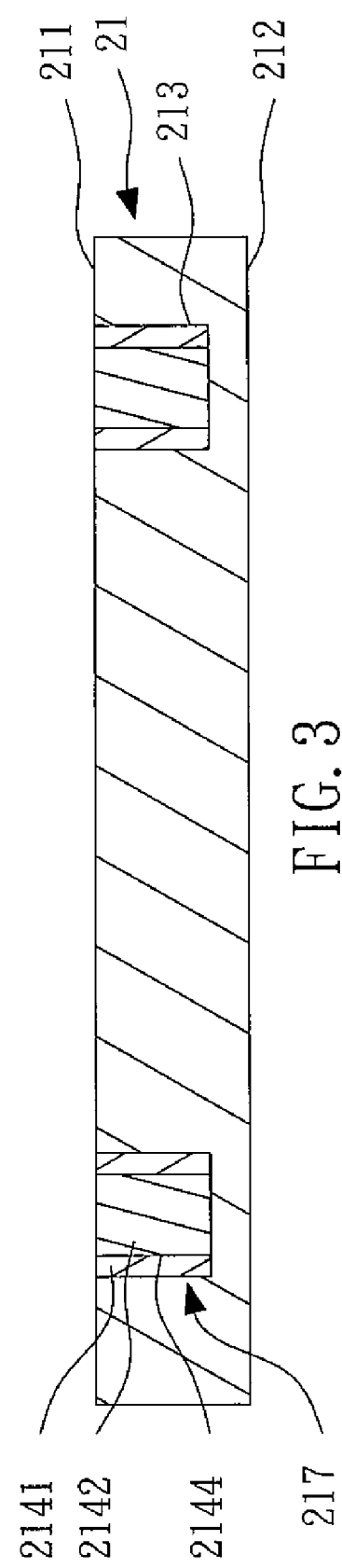

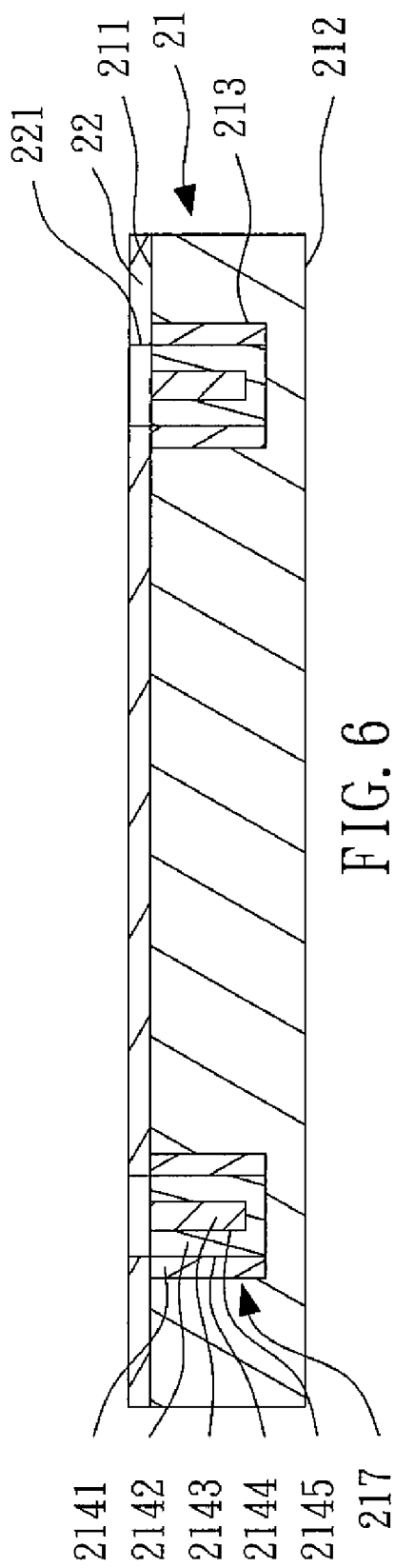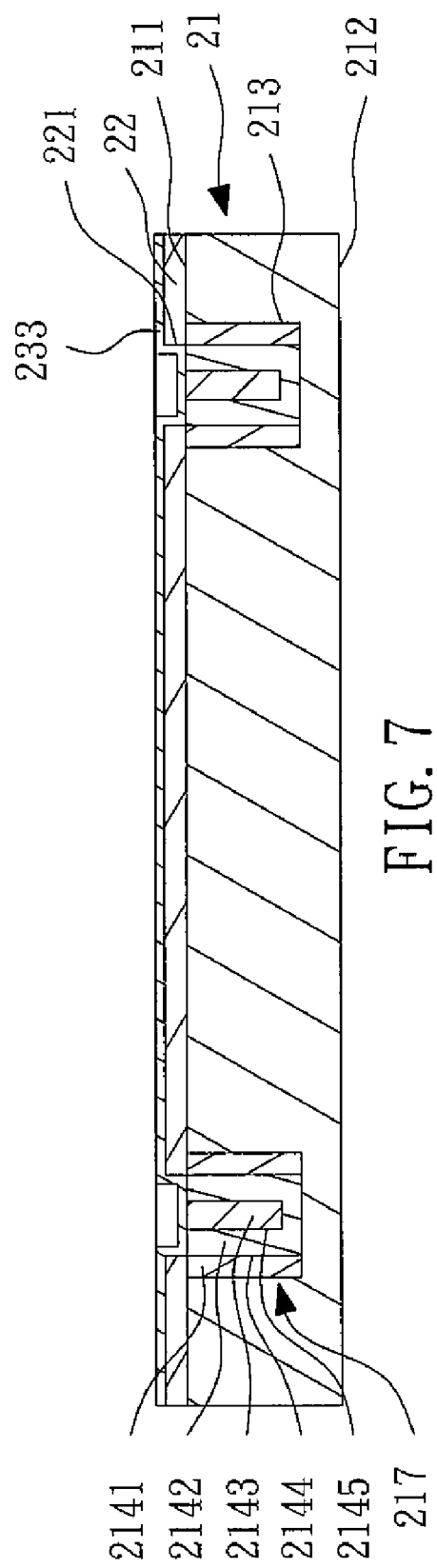

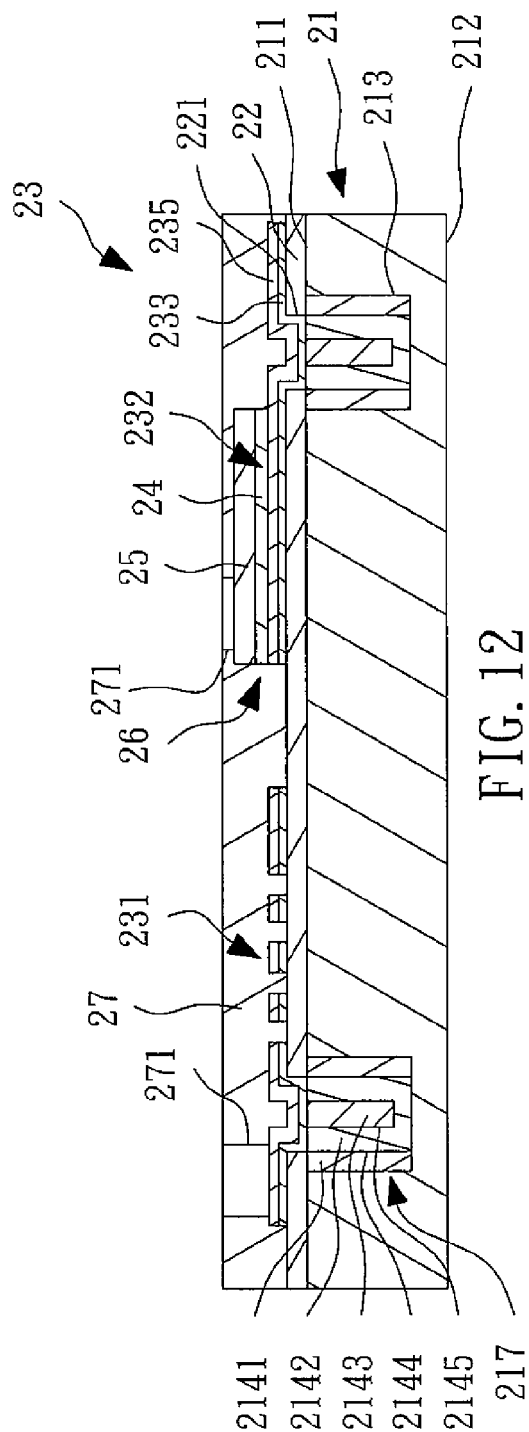
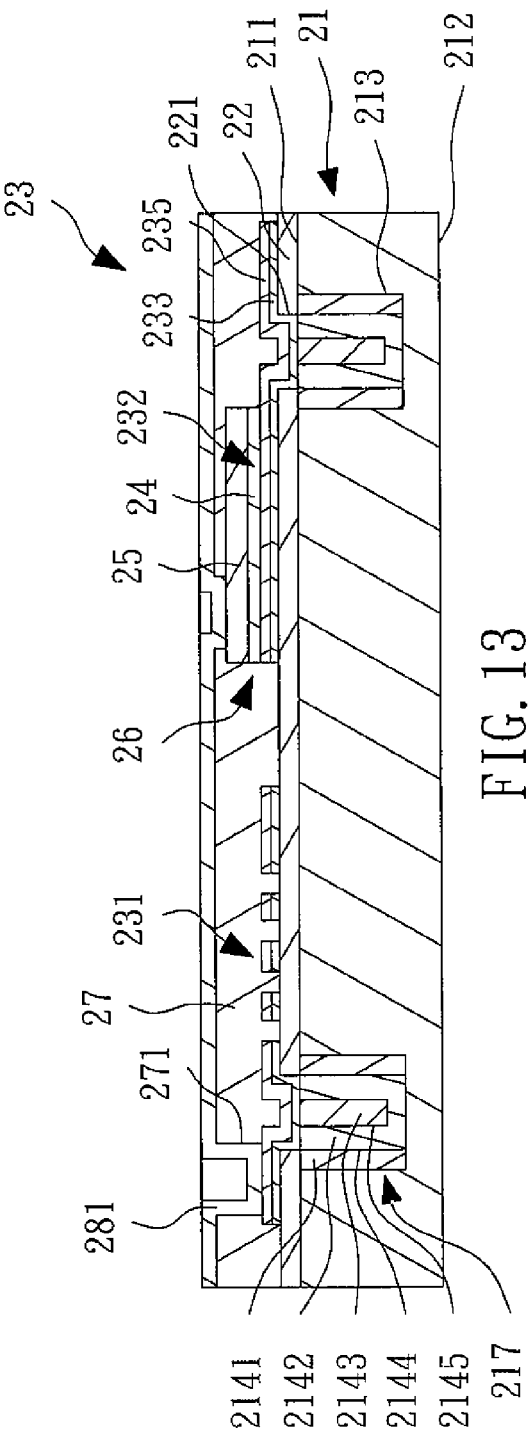

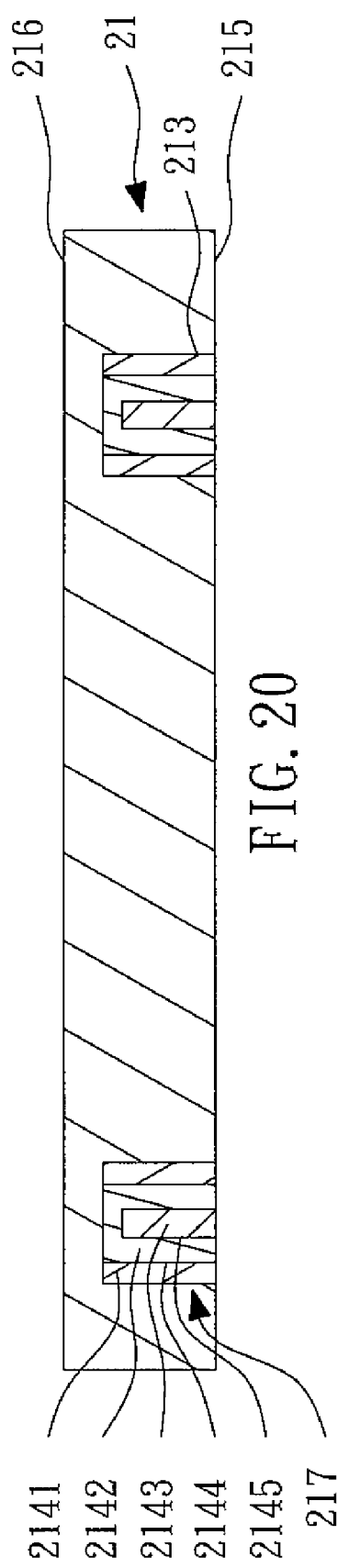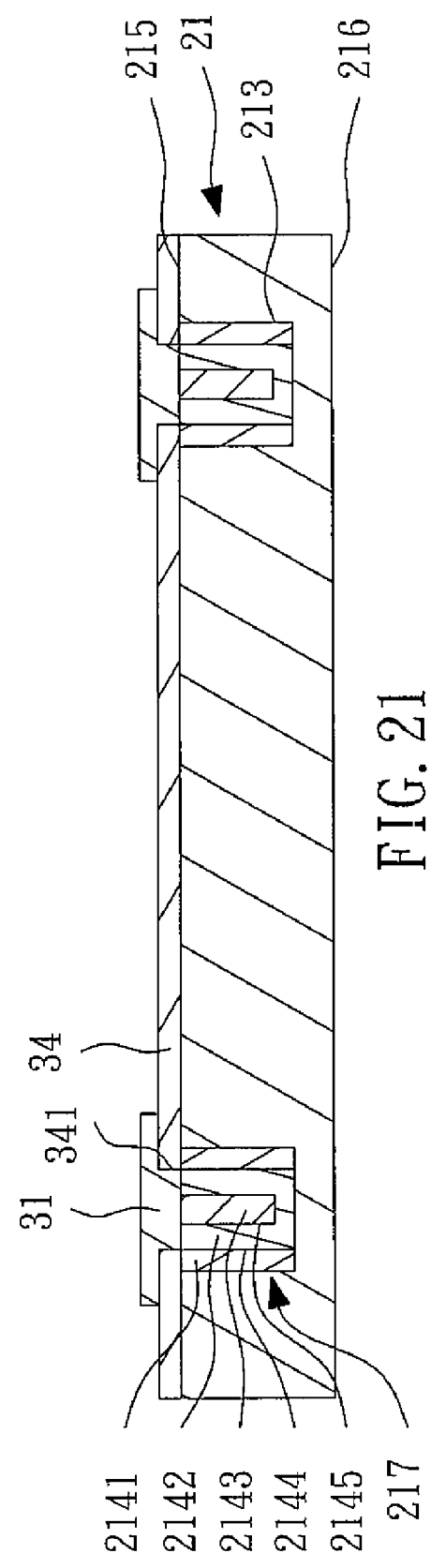

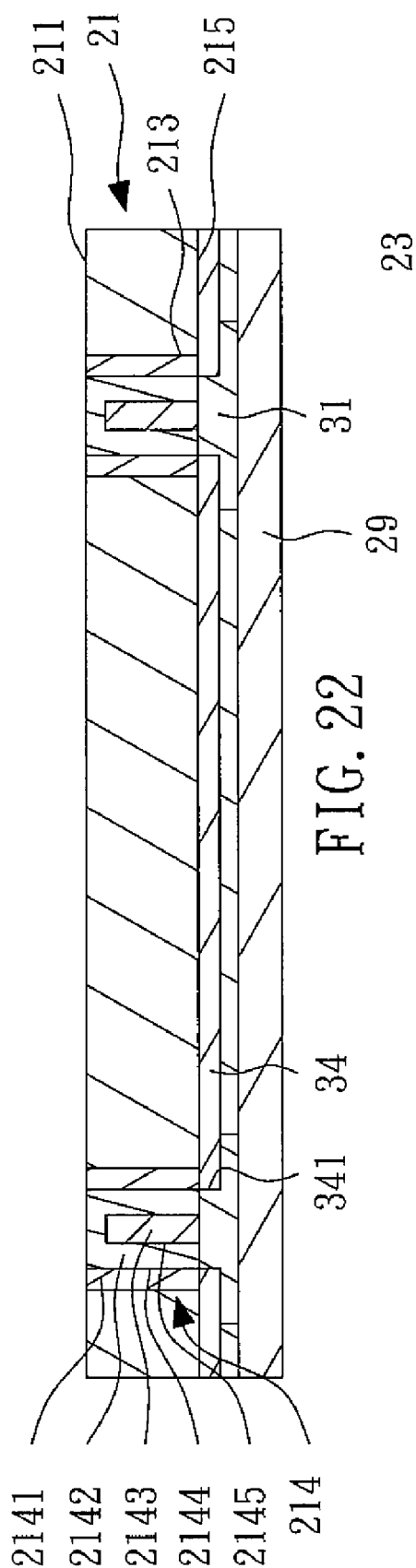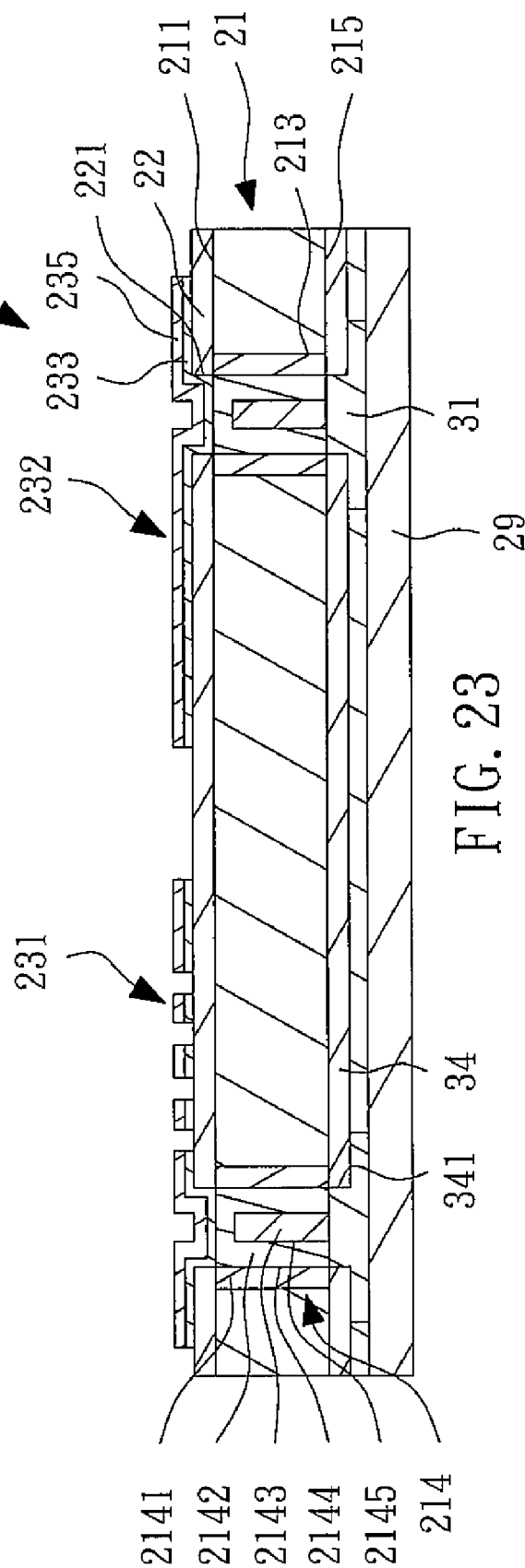
FIG. 22
FIG. 23

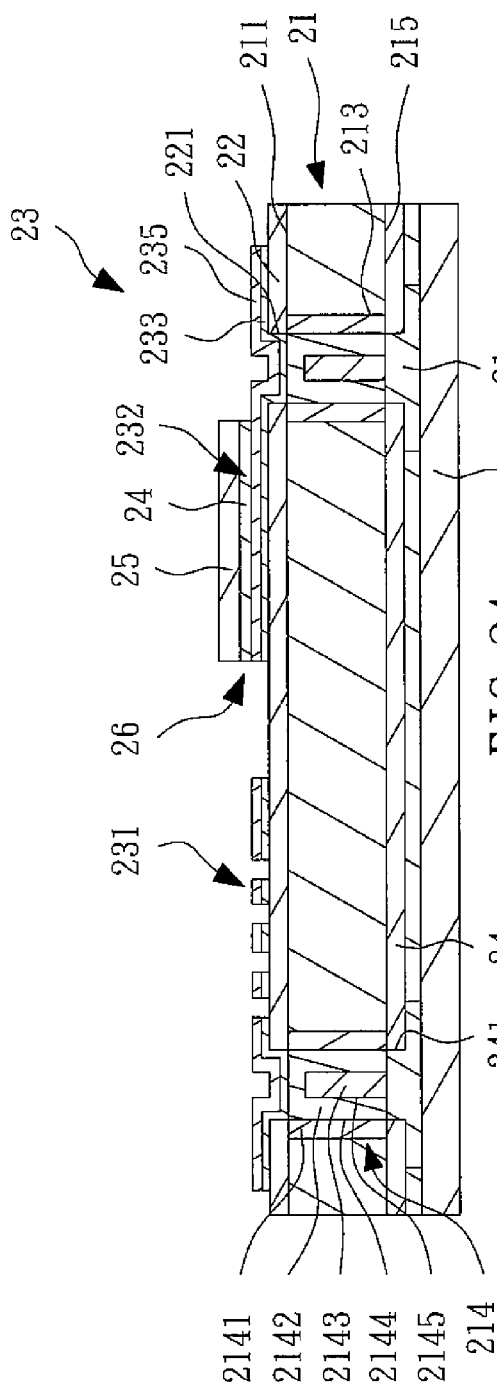
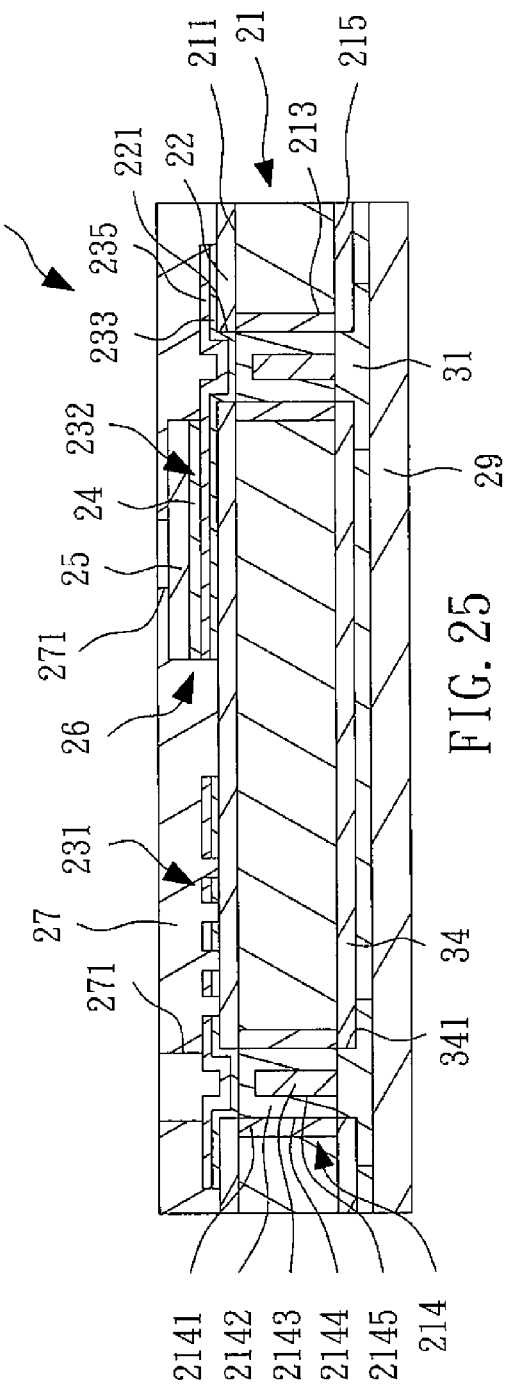
FIG. 24
FIG. 25

SEMICONDUCTOR PACKAGE AND METHOD FOR MAKING THE SAME

BACKGROUND OF THE INVENTION

1. Field of the Invention

The present invention relates to a semiconductor package and a method for making the same, and more particularly, to a semiconductor package with passive devices integrated therein and a method for making the same.

2. Description of the Related Art

FIG. 1 shows a cross-sectional view of a conventional semiconductor package. As shown in FIG. 1, the conventional semiconductor package 1 comprises a substrate 11, a packaged unit 12 and a molding compound 13. The packaged unit 12 comprises a plurality of passive devices (not shown). The packaged unit 12 is disposed on and is electrically connected to the substrate 11. The molding compound 13 encapsulates the packaged unit 12.

The conventional semiconductor package 1 has following defects. Since the passive devices are first integrated in the packaged unit 12 by using a semiconductor process and the packaged unit 12 is then electrically connected to the substrate 11 by wire bonding or flip-chip bonding (not shown), thus causing a complicated process of integrating the passive devices in the packaged unit 12 and a high production cost.

Consequently, there is an existing need for a semiconductor package and a method for making the same that solves the above-mentioned problems.

SUMMARY OF THE INVENTION

The present invention provides a method for making a semiconductor package. The method comprises the steps of: (a) providing a base material; (b) forming a first metal layer on the base material, wherein the first metal layer comprises a first inductor and a first lower electrode; (c) forming a first dielectric layer and a first upper electrode on the first lower electrode, wherein the first dielectric layer is disposed between the first upper electrode and the first lower electrode, and the first upper electrode, the first dielectric layer and the first lower electrode form a first capacitor; and (d) forming a first protective layer, so as to encapsulate the first inductor and the first capacitor.

Whereby, the first inductor and the first lower electrode of the first capacitor are formed simultaneously on the same layer, so as to achieve the effect of integrating plural passive devices and improve the production efficiency.

The present invention further provides a semiconductor package. The semiconductor package includes a base material, a first metal layer, a first dielectric layer, a first upper electrode and a first protective layer. The base material has a first surface and a second surface. The first metal layer is disposed on the first surface of the base material and includes a first inductor and a first lower electrode. The first dielectric layer is disposed on the first lower electrode. The first upper electrode is disposed on the first dielectric layer, and the first upper electrode, the first dielectric layer and the first lower electrode form a first capacitor. The first protective layer encapsulates the first inductor and the first capacitor.

The present invention further provides a semiconductor package. The semiconductor package includes a base material, a first dielectric layer, a first upper electrode and a first protective layer. The base material has a first surface, a second surface, at least one groove and at least one through via structure. The groove penetrates the first surface and the second surface. The through via structure is disposed in the groove and exposed on the first surface and the second surface. The first metal layer is disposed on the first surface of the base material and includes a first inductor and a first lower electrode. The first metal layer directly contacts the through via structure. The first dielectric layer is disposed on the first lower electrode, and the first upper electrode is disposed on the first dielectric layer. The first upper electrode, the first dielectric layer and the first lower electrode form a first capacitor. The first protective layer encapsulates the first inductor and the first capacitor.

Whereby, the first inductor and the first lower electrode of the first capacitor are disposed on the same layer, so that the thickness of the product is reduced.

BRIEF DESCRIPTION OF THE DRAWINGS

FIGS. 2-18 are schematic views of a method for making a semiconductor package according to a first embodiment of the present invention;

FIGS. 20-26 are schematic views of a method for making a semiconductor package according to the second embodiment of the present invention.

DETAILED DESCRIPTION OF THE INVENTION

Figure 1:
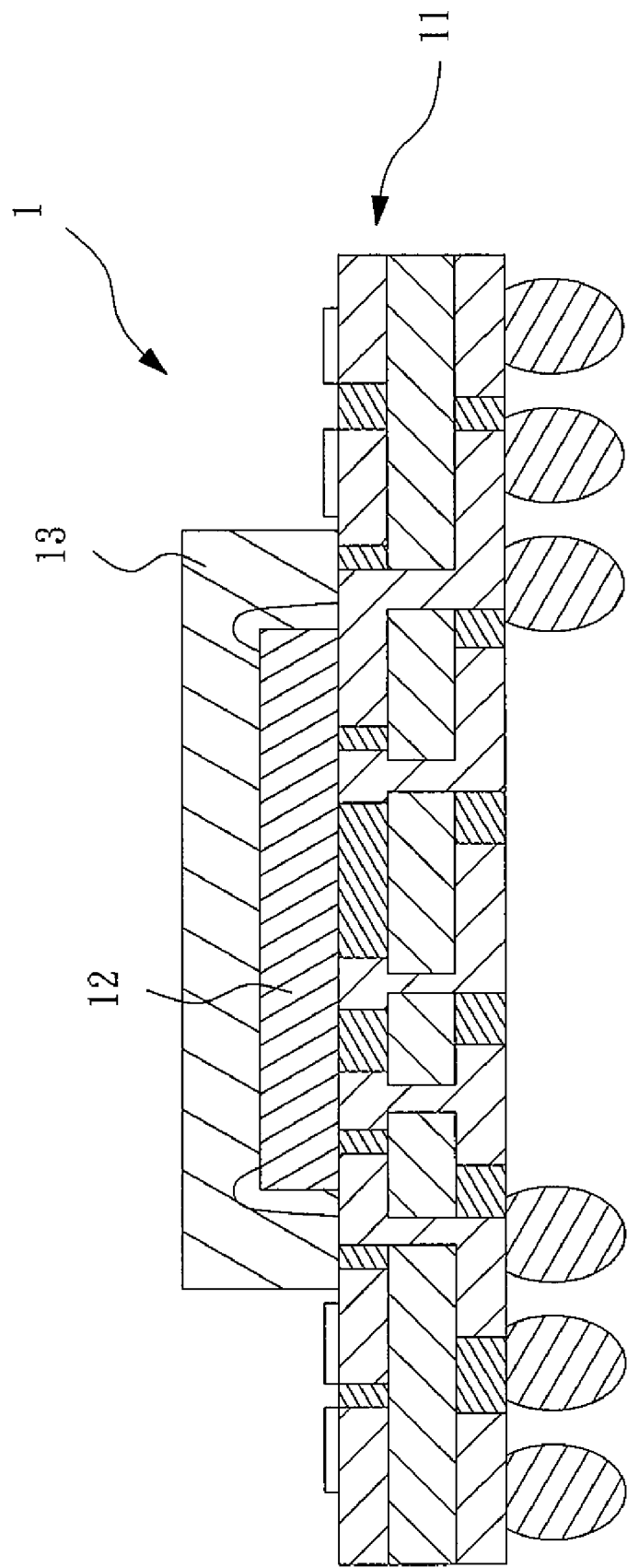
FIG. 1 is a cross-sectional view of a conventional semiconductor package.

FIGS. 2-19 are schematic views of a method for making a semiconductor package according to a first embodiment of the present invention. As shown in FIG. 2, a base material 21 is provided. In this embodiment, the base material 21 comprises a first surface 211, a bottom surface 212, at least one outer groove 213 and at least one conductive via structure 217. The outer groove 213 opens at the first surface 211 of the base material 21. The conductive via structure 217 is disposed in the outer groove 213 and exposed on the first surface 211 of the base material 21.

In this embodiment, the base material 21 is made of non-insulation material such as silicon or germanium. The conductive via structure 217 comprises an outer insulation layer 2141, a conductor 2142 and an inner insulation layer 2143. The outer insulation layer 2141 is disposed on the side wall of the outer groove 213 to define a first central groove 2144, the conductor 2142 is disposed on the side wall of the first central groove 2144 so as to define a second central groove 2145, and the second central groove 2145 is filled with the inner insulation layer 2143. In other embodiments, the outer insulation layer 2141 can also be disposed on the bottom wall of the outer groove 213 (not shown). Since the base material 21 is made of non-insulation material, the outer insulation layer 2141 is used to insulate the base material 21 and the conductor 2142 to avoid the current which passes through the conductive via structure 217 being conducted to the base material 21 and reducing the electrical effects of the conductive via structure 217.

Figure 4:
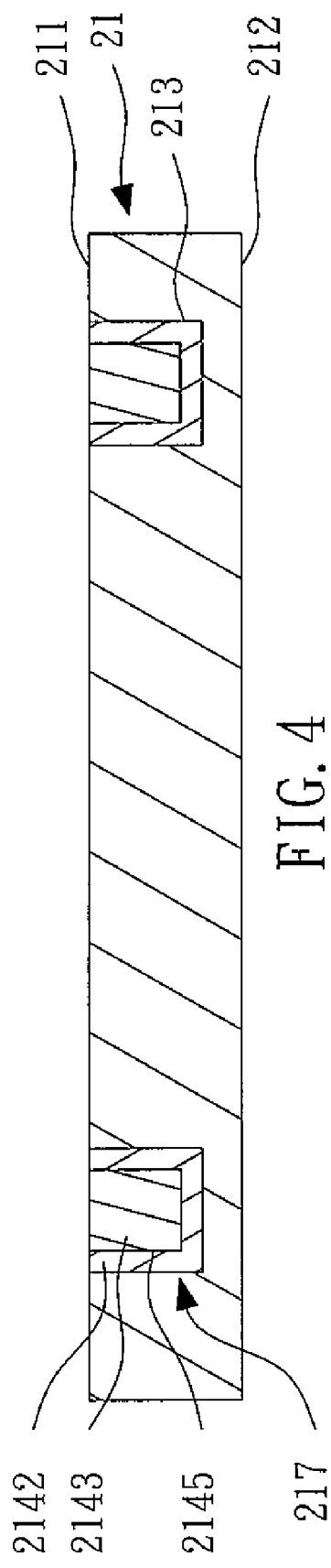
Figure 5:
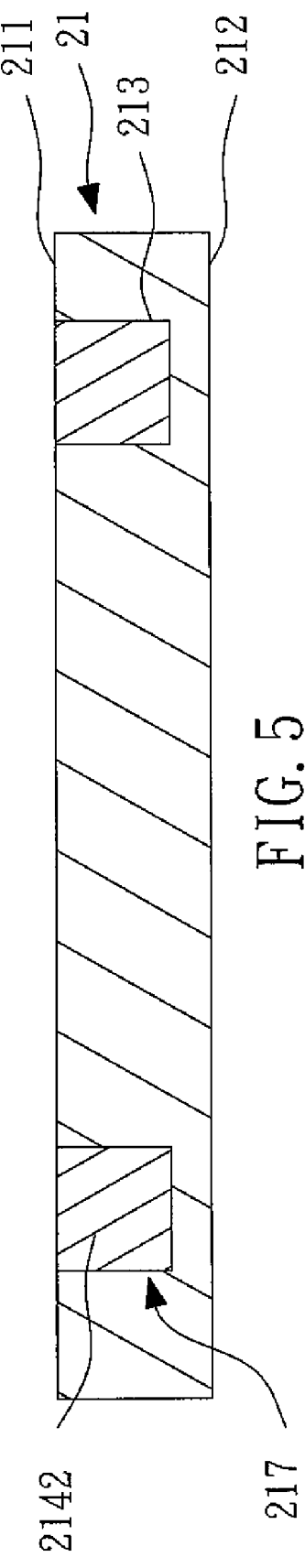

However, in other embodiments, as shown in FIG. 3, the conductive via structure 217 can only comprise an outer insulation layer 2141 and a conductor 2142 but does not comprise the inner insulation layer 2143 (FIG. 2). The outer insulation layer 2141 is disposed on the side wall of the outer groove 213 to define a first central groove 2144, and the first central groove 2144 is filled with the conductor 2142. In addition, the base material 21 can be made of insulation material such as glass or silica, and the conductive via structure 217 may not comprise the outer insulation layer 2141 (FIG. 2). Therefore, as shown in FIG. 4, the conductive via structure 217 can only comprise a conductor 2142 and an inner insulation layer 2143, wherein the conductor 2142 is disposed on the side wall and the bottom portion of the outer groove 213 to define a second central groove 2145, and the second central groove 2145 is filled with the inner insulation layer 2143. Alternatively, as shown in FIG. 5, the conductive via structure 217 can only comprise a conductor 2142, wherein the outer groove 213 is filled with the conductor 2142. As shown in FIG. 6, a first passivation layer 22 is formed on the base material 21. In this embodiment, the first passivation layer 22 is formed on the first surface 211 of the base material 21 and has a first through hole 221, and the first through hole 221 exposes the conductive via structure 217.

Figure 8:
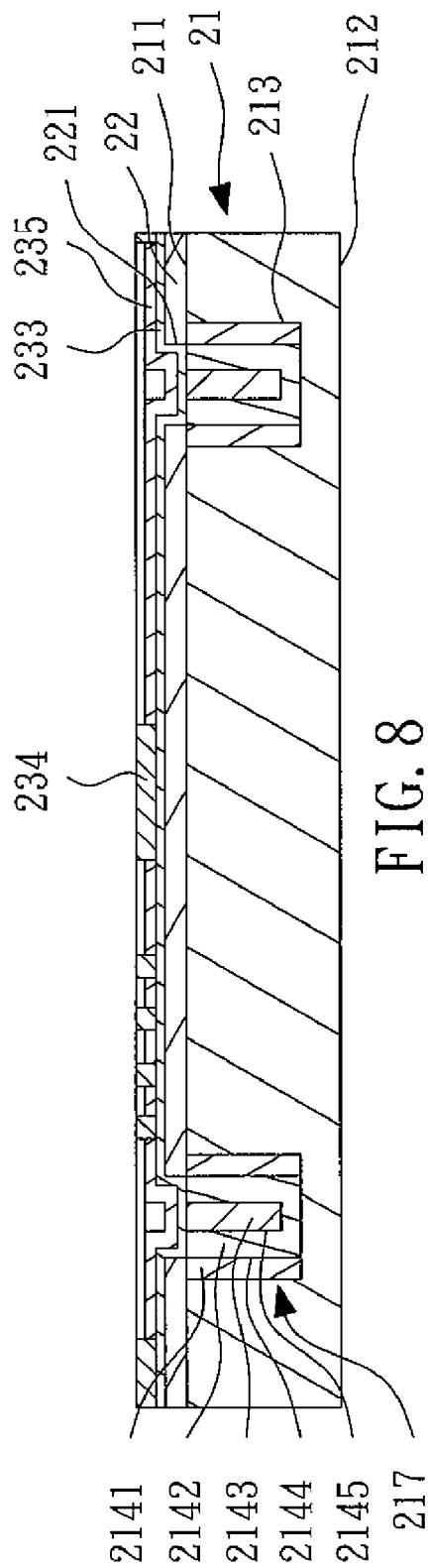
Figure 9:
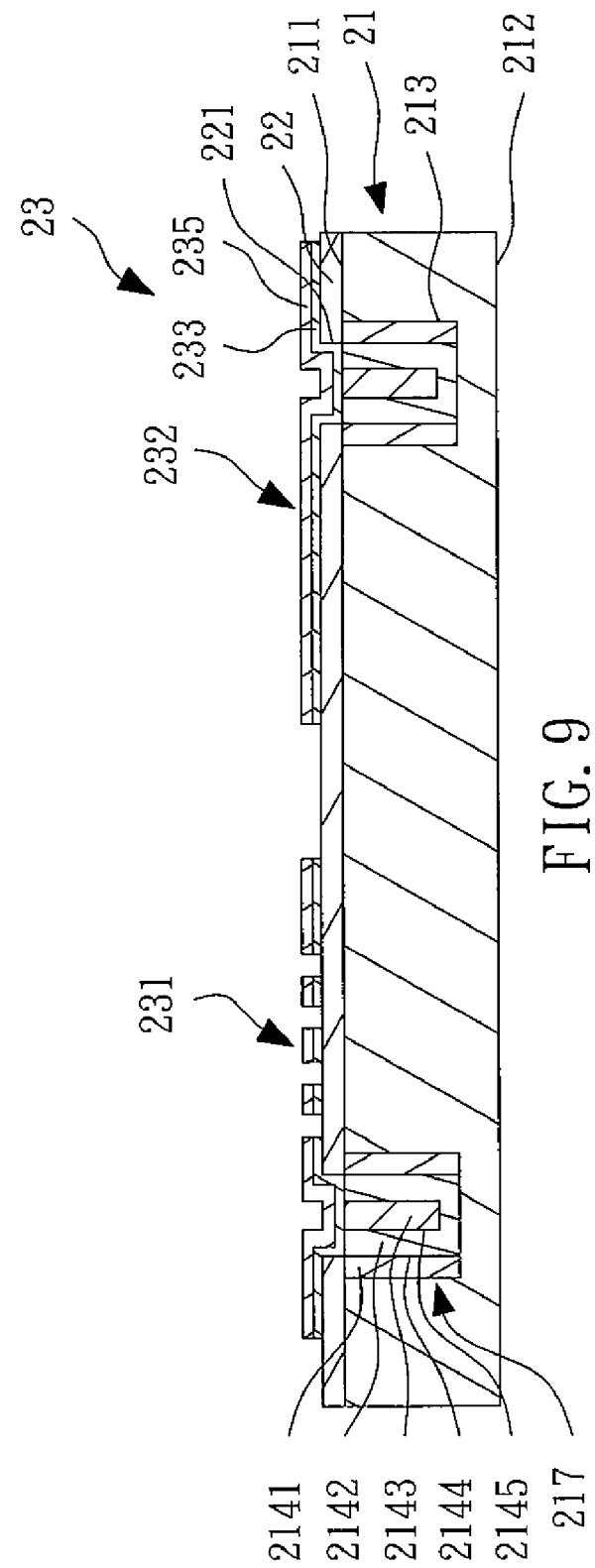

Then, a first metal layer 23 (FIG. 9) is formed on the base material 21. The first metal layer 23 includes a first inductor 231 and a first lower electrode 232. In this embodiment, the first metal layer 23 is formed on the first passivation layer 22 and directly contacts the conductive via structure 217. In this embodiment, the steps of forming the first metal layer 23 are described as follows. As shown in FIG. 7, a first seed layer 233 is formed on the base material 21. As shown in FIG. 8, a first photoresist 234 is formed on the first seed layer 233 so as to cover part of the first seed layer 233 and expose part of the first seed layer 233, and a first plated layer 235 is formed on the exposed part of the first seed layer 233. As shown in FIG. 9, the first photoresist 234 (FIG. 8) and the covered part of the first seed layer 233 are removed, wherein the first plated layer 235 and part of the first seed layer 233 form the first metal layer 23.

Figure 10:
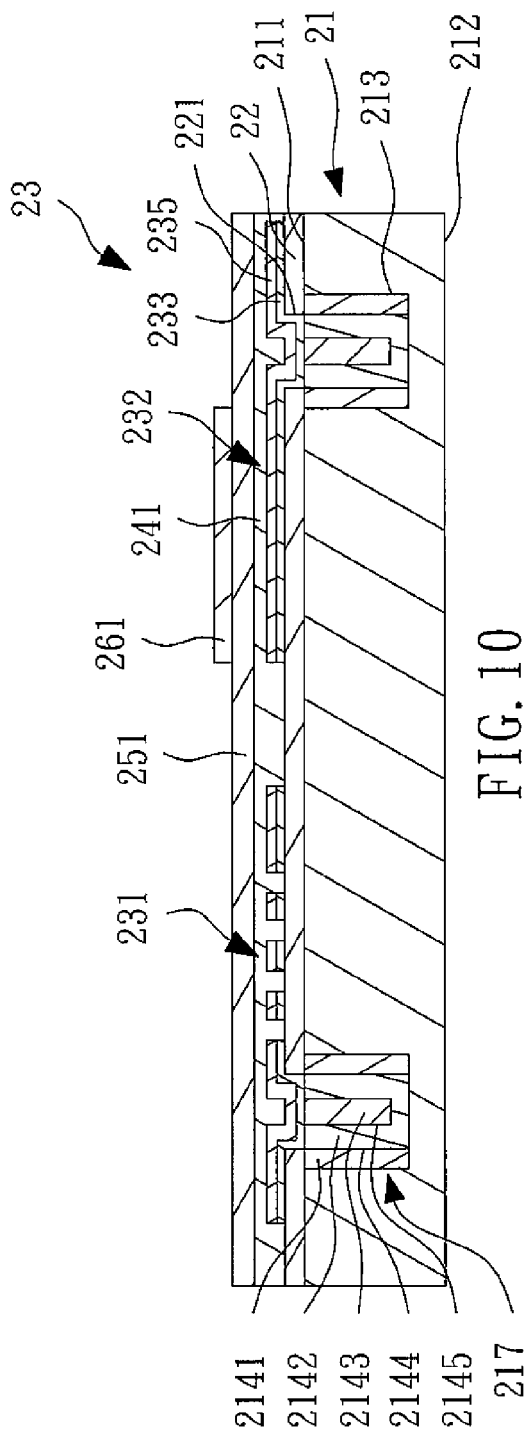
Figure 11:
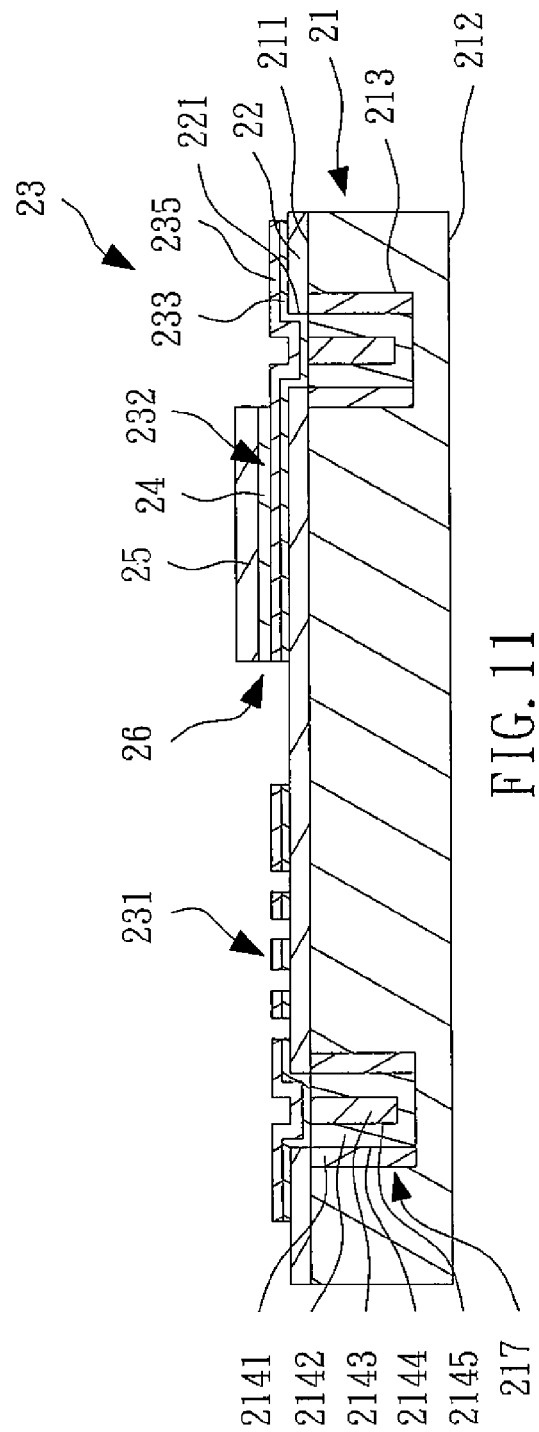

Then, a first dielectric layer 24 (FIG. 11) and a first upper electrode 25 (FIG. 11) are formed on the first lower electrode 232. The first dielectric layer 24 is disposed between the first upper electrode 25 and the first lower electrode 232, and the first upper electrode 25, the first dielectric layer 24 and the first lower electrode 232 form a first capacitor 26 (FIG. 11). In this embodiment, the steps of forming the first dielectric layer 24 are described as follows. As shown in FIG. 10, firstly, a second metal layer is formed (for example, by sputtering) on the first lower electrode 232, and the second metal layer is anodized, so as to form a first oxidation layer 241. The second metal layer is made of tantalum (Ta), and the first oxidation layer 241 is made of tantalum pentoxide ($Ta_2O_5$). Then, a third metal layer 251 is formed (for example, by sputtering) on the first oxidation layer 241, wherein the third metal layer 251 is made of AlCu. Finally, a second photoresist 261 is formed on the third metal layer 251. As shown in FIG. 11, part of the first oxidation layer 241 (FIG. 10) and part of the third metal layer 251 (FIG. 10) are removed, so as to form the first dielectric layer 24 and the first upper electrode 25, respectively. Meanwhile, the first capacitor 26 is formed, and the second photoresist 261 (FIG. 10) is removed. As shown in FIG. 12, a first protective layer 27 is formed, so as to encapsulate the first inductor 231 and the first capacitor 26. The first protective layer 27 comprises at least one first opening 271, and the first opening 271 exposes part of the first metal layer 23 or part of the first upper electrode 25.

Figure 14:
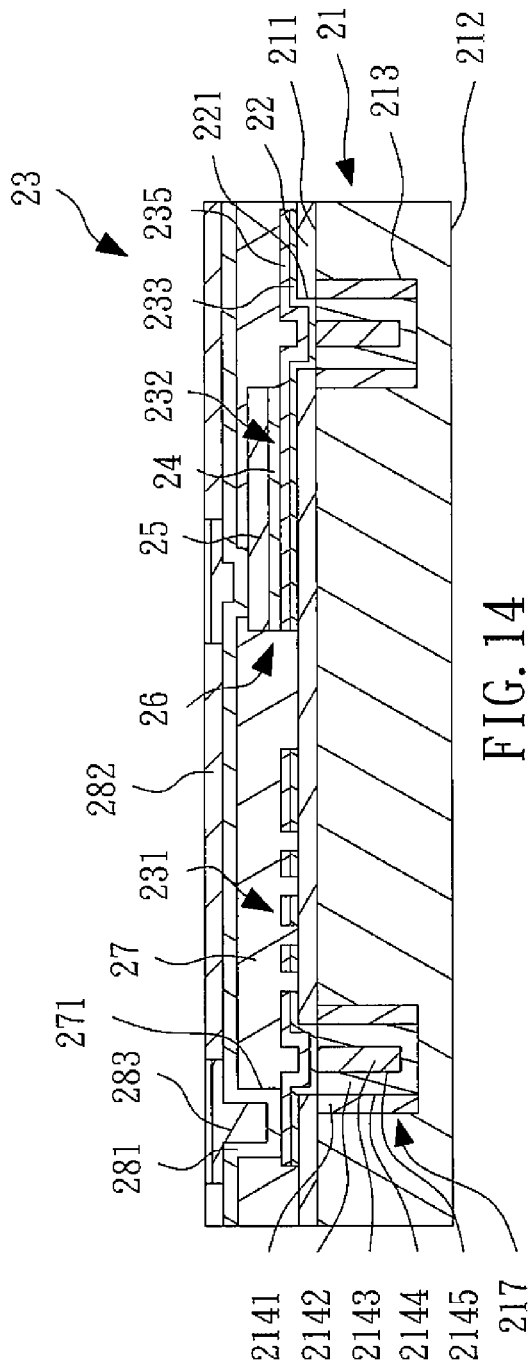
Figure 15:
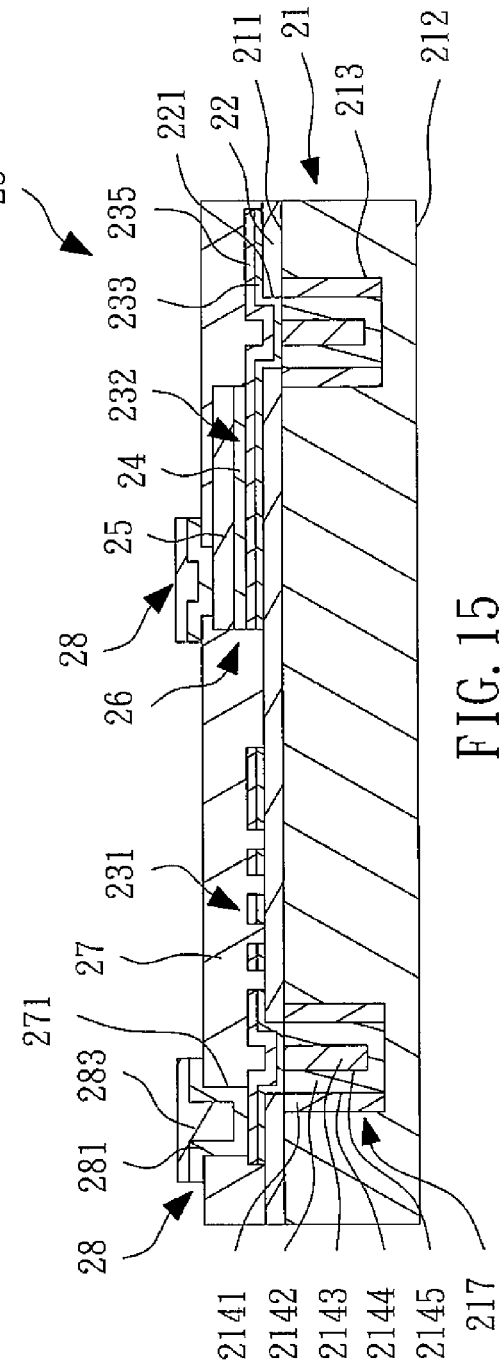

Then, at least one first bump 28 (FIG. 15) is formed in the first opening 271 of the first protective layer 27. In this embodiment, the steps of forming the first bump 28 are described as follows. As shown in FIG. 13, a second seed layer 281 is formed on the first protective layer 27. As shown in FIG. 14, a third photoresist 282 is first formed on the second seed layer 281, so as to cover part of the second seed layer 281 and expose part of the second seed layer 281. Then, a second plated layer 283 is formed on the exposed part of the second seed layer 281. As shown in FIG. 15, the third photoresist 282 and the covered part of the second seed layer 281 are removed, so as to form the first bump 28.

Figure 16:
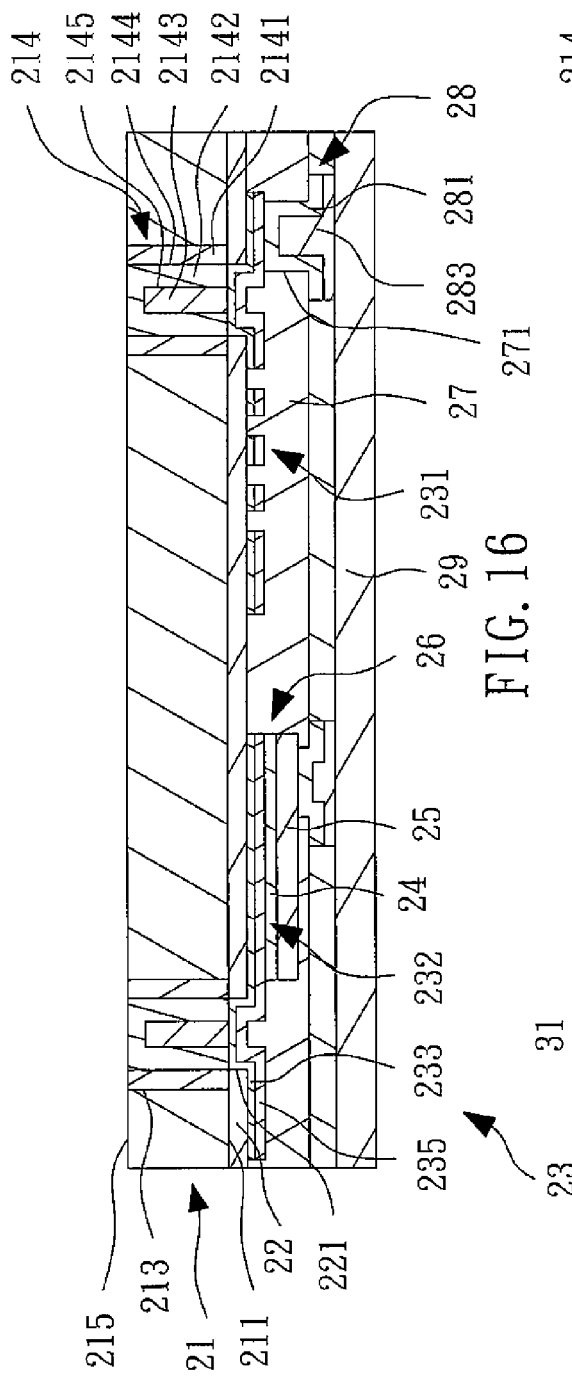

As shown in FIG. 16, the base material 21 is disposed on a carrier 29, wherein the first surface 211 of the base material 21 faces the carrier 29. Part of the base material 21 is removed from the bottom surface 212 (FIG. 15), to form a second surface 215 and to expose the conductor 2142 of the conductive via structure 217 (FIG. 15) on the second surface 215, so as to form a through via structure 214. However, in other embodiments, more part of the base material 21 can be further removed, so that the inner insulation layer 2143 of the conductive via structure 217 (FIG. 15) is also exposed on the second surface 215, which can ensure that the conductor 2142 is exposed on the second surface 215.

Figure 17:
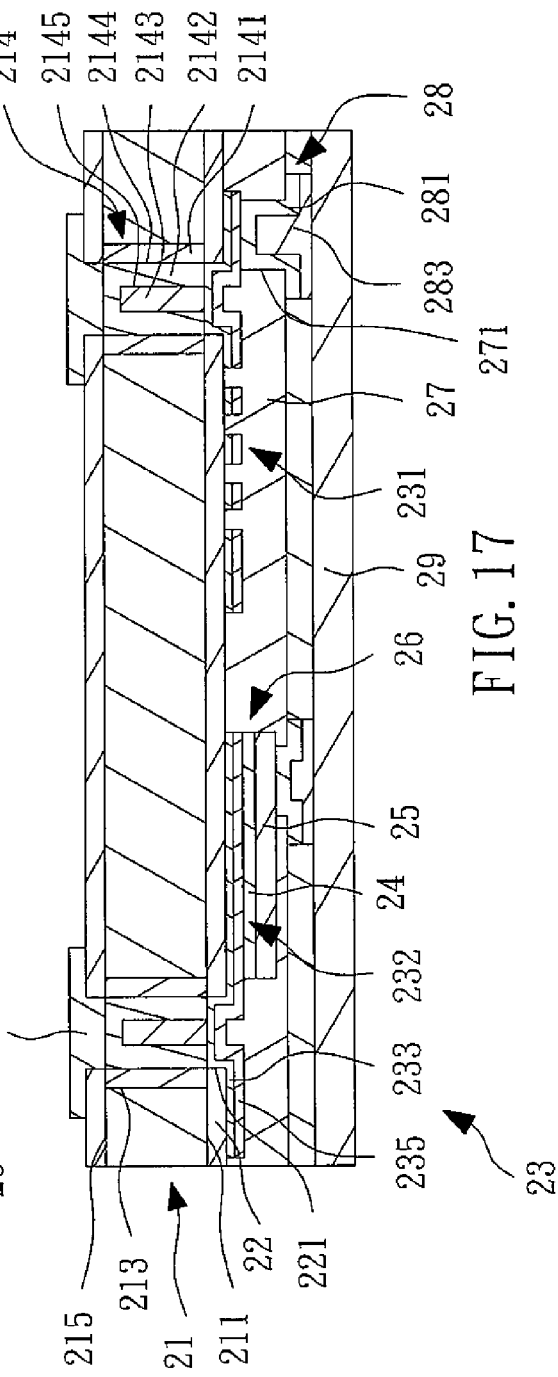
Figure 18:
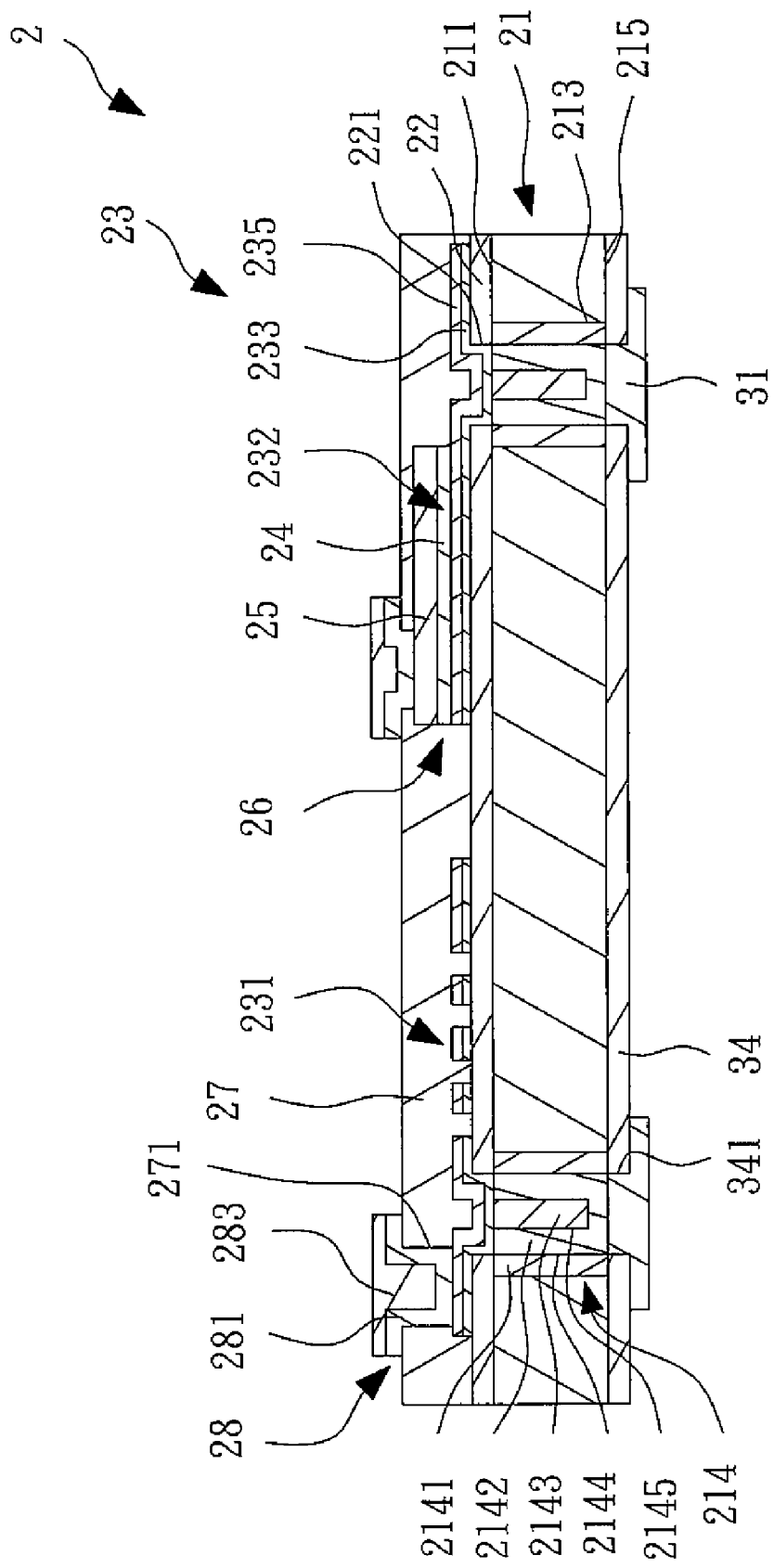
Figure 19:
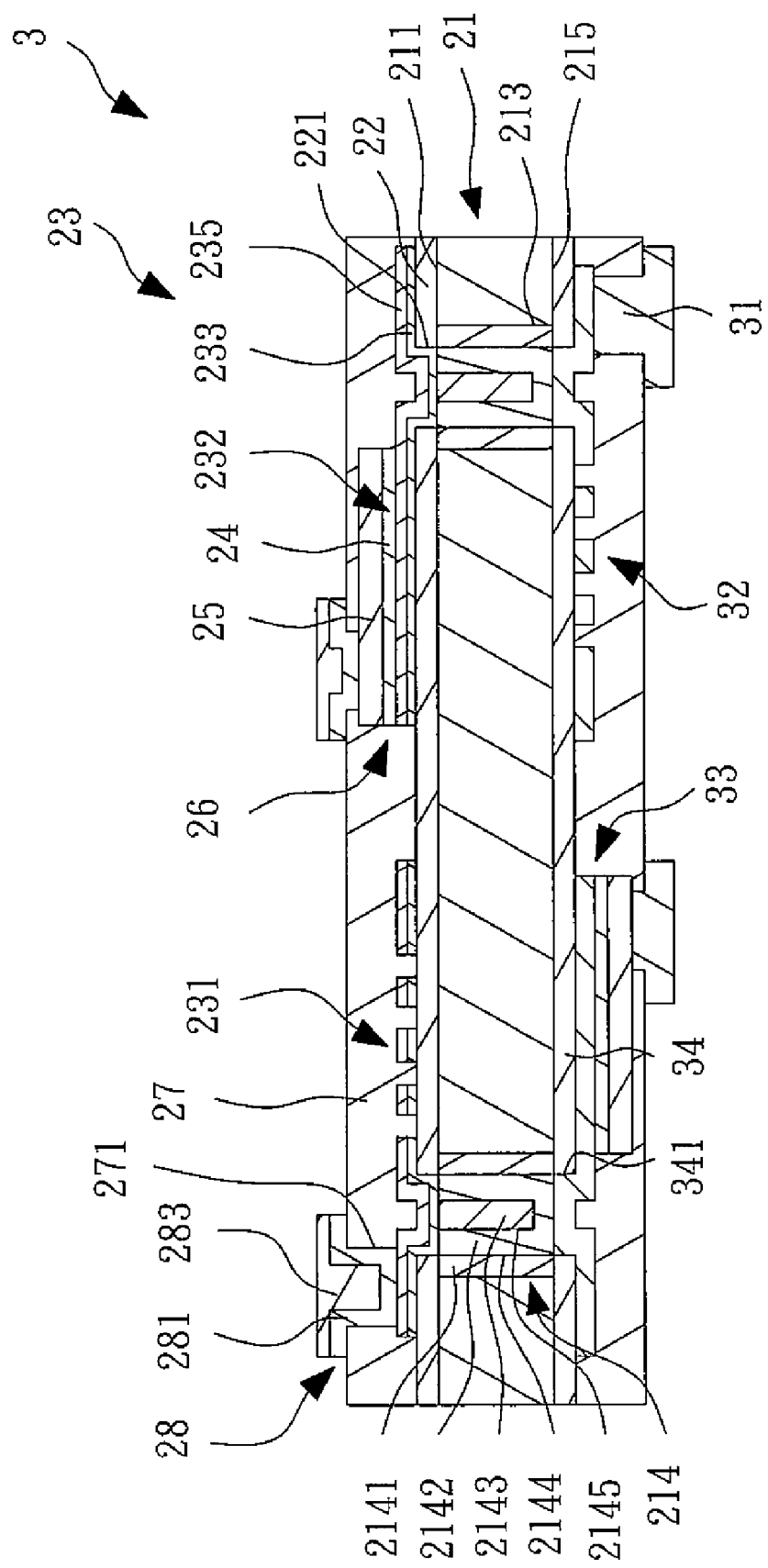
FIG. 19 is a cross-sectional view of a semiconductor package according to a second embodiment of the present invention.

As shown in FIG. 17, at least one electrical device is formed on the second surface 215 of the base material 21. In this embodiment, the electrical device is a second bump 31, and the method for making the second bump 31 is the same as that for making the first bump 28 and therefore not described in detail. As shown in FIG. 18, the carrier 29 is removed, and a semiconductor package 2 according to a first embodiment of the present invention is made. However, the electrical device can be a second inductor 32 and a second capacitor 33, as shown in FIG. 19. The method for making the second inductor 32 and the second capacitor 33 is the same as that for making the first inductor 231 and the first capacitor 26. That is, the manufacturing process applied to the second surface 215 of the base material 21 is the same as that applied to the first surface 211 of the base material 21 and therefore not described in detail.

As a result, the first inductor 231 and the first lower electrode 232 of the first capacitor 26 are formed simultaneously on the same layer, so the effect of integrating plural passive devices can be achieved and the production efficiency can be improved.

FIG. 18 shows a cross-sectional view of the semiconductor package according to the first embodiment of the present invention. As shown in FIG. 18, the semiconductor package 2 includes a base material 21, a first passivation layer 22, a second passivation layer 34, a first metal layer 23, a first dielectric layer 24, a first upper electrode 25, a first protective layer 27, at least one first bump 28 and at least one electrical device. The base material 21 has a first surface 211, a second surface 215, at least one outer groove 213 and at least one through via structure 214. The outer groove 213 penetrates the first surface 211 and the second surface 215. The through via structure 214 is disposed in the outer groove 213 and exposed on the first surface 211 and the second surface 215. However, in other embodiments, the base material 21 may not comprise the outer groove 213 and the through via structure 214.

In this embodiment, the base material 21 is made of non-insulation material such as silicon or germanium. The through via structure 214 comprises an outer insulation layer 2141, a conductor 2142 and an inner insulation layer 2143. The outer insulation layer 2141 is disposed on the side wall of the outer groove 213 to define a first central groove 2144, the conductor 2142 is disposed on the side wall of the first central groove 2144 so as to define a second central groove 2145, and the second central groove 2145 is filled with the inner insulation layer 2143. Since the base material 21 is made of non-insulation material, the outer insulation layer 2141 is used to insulate the base material 21 and the conductor 2142 to avoid the current which passes through the through via structure 214 being conducted to the base material 21 to reduce the electrical effects of the through via structure 214.

However, in other embodiments, the through via structure 214 can only comprise an outer insulation layer 2141 and a conductor 2142 but does not comprise the inner insulation layer 2143. The outer insulation layer 2141 is disposed on the side wall of the outer groove 213 to define a first central groove 2144, and the first central groove 2144 is filled with the conductor 2142. In addition, the base material 21 can be made of insulation material such as glass or silica, and the through via structure 214 may not comprise the outer insulation layer 2141. Therefore, the through via structure 214 can only comprise a conductor 2142 and an inner insulation layer 2143, wherein the conductor 2142 is disposed on the side wall of the outer groove 213 to define a second central groove 2145, and the second central groove 2145 is filled with the inner insulation layer 2143. Alternatively, the through via structure 214 can only comprise a conductor 2142, and the outer groove 213 is filled with the conductor 2142.

The first passivation layer 22 is formed on the first surface 211 of the base material 21 and has a first through hole 221, and the first through hole 221 exposes the through via structure 214. The second passivation layer 34 is disposed on the second surface 215 of the base material 21 and has a second through hole 341, and the second through hole 341 exposes the through via structure 214. The first metal layer 23 is formed on the first surface 211 of the base material 21. Preferably, the first metal layer 23 is formed on the first passivation layer 22, includes a first inductor 231 and a first lower electrode 232, and directly contacts the through via structure 214. The first dielectric layer 24 is disposed on the first lower electrode 232. In this embodiment, the first dielectric layer 24 is made of tantalum pentoxide ($Ta_2O_5$). The first upper electrode 25 is disposed on the first dielectric layer 24, and the first upper electrode 25, the first dielectric layer 24 and the first lower electrode 232 form a first capacitor 26. In this embodiment, the first upper electrode 25 is made of AlCu.

The first protective layer 27 encapsulates the first inductor 231 and the first capacitor 26. In this embodiment, the first protective layer 27 comprises at least one first opening 271, and the first opening 271 exposes part of the first metal layer 23 or part of the first upper electrode 25. The first bump 28 is disposed in the first opening 271 of the first protective layer 27. The electrical device is disposed on the second surface 215 of the base material 21. The electrical device is a second bump 31.

As a result, the first inductor 231 and the first lower electrode 232 of the first capacitor 26 are disposed on the same layer, so that the thickness of the product is reduced.

FIG. 19 shows a cross-sectional view of the semiconductor package according to a second embodiment of the present invention. As shown in FIG. 19, the semiconductor package 3 of the second embodiment and the semiconductor package 2 (FIG. 18) of the first embodiment are substantially the same, and the same elements are designated with the same numerals. The difference between the second embodiment and the first embodiment is that the second surface 215 of the semiconductor package 3 further comprises a plurality of electrical devices such as a second inductor 32, a second capacitor 33 and a second bump 31.

FIGS. 20-26 are schematic views of a method for making a semiconductor package according to the second embodiment of the present invention. As shown in FIG. 20, a base material 21 is provided. In this embodiment, the base material 21 comprises a top surface 216 and a second surface 215. The outer groove 213 opens at the second surface 215 of the base material 21, and the conductive via structure 217 is exposed on the second surface 215 of the base material 21. As shown in FIG. 21, a second passivation layer 34 is formed on the base material 21. In this embodiment, the second passivation layer 34 is disposed on the second surface 215 of the base material 21 and has a second through hole 341, and the second through hole 341 exposes the conductive via structure 217. Then, at least one electrical device is formed on the second surface 215 of the base material 21, preferably on the second passivation layer 34. In this embodiment, the electrical device is a second bump 31. As shown in FIG. 22, the base material 21 is disposed on a carrier 29, wherein the second surface 215 of the base material 21 faces the carrier 29. Part of the base material 21 is removed from the top surface 216 (FIG. 21), to form a first surface 211 and to expose the conductive via structure 217 (FIG. 21) on the first surface 211, so as to form a through via structure 214.

Figure 26:
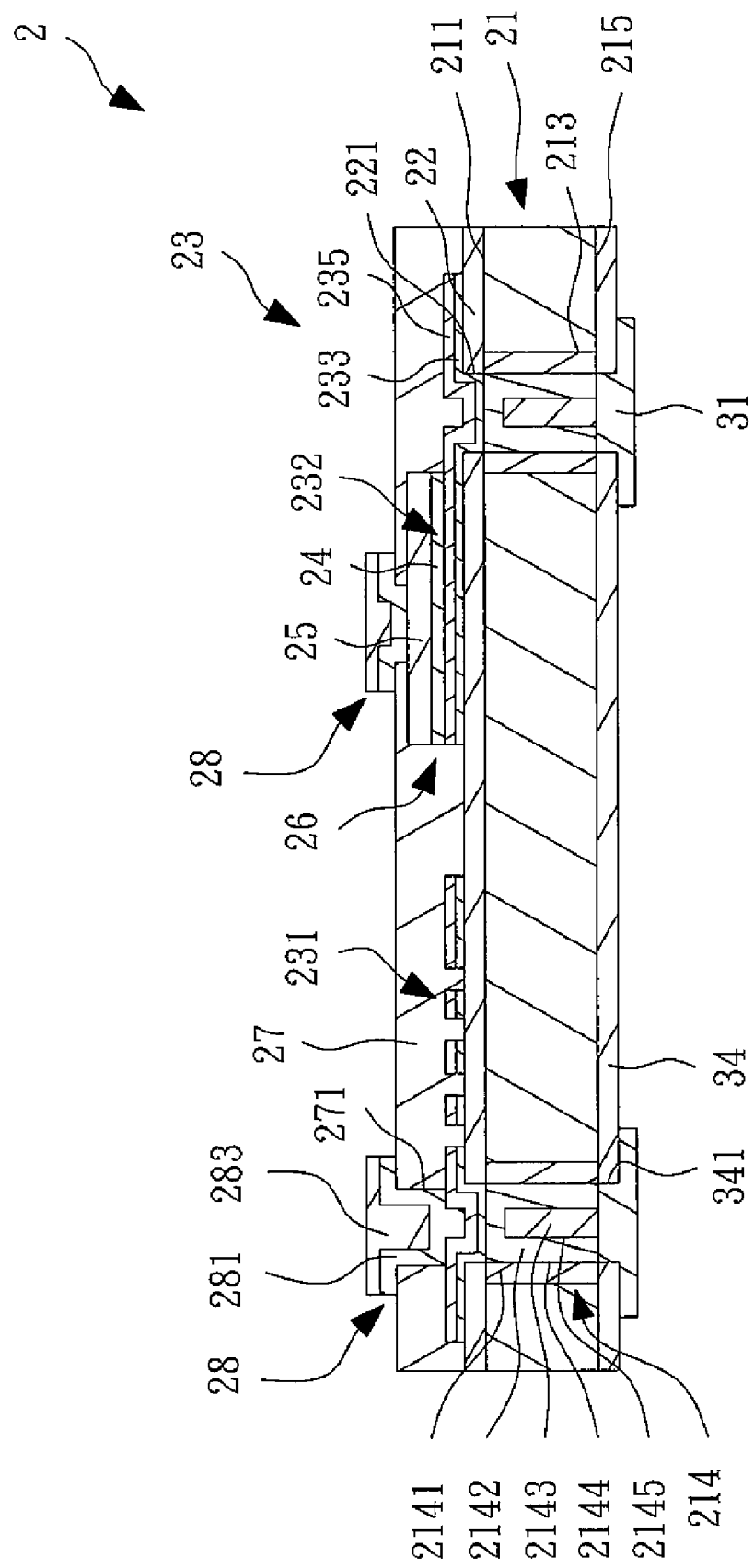

As shown in FIG. 23, a first metal layer 23 is formed on the base material 21, preferably on the first surface 211 of the base material 21. A first plated layer 235 and a first seed layer 233 form the first metal layer 23. The first metal layer 23 includes a first inductor 231 and a first lower electrode 232. As shown in FIG. 24, a first dielectric layer 24 and a first upper electrode 25 are formed on the first lower electrode 232. The first dielectric layer 24 is disposed between the first upper electrode 25 and the first lower electrode 232, and the first upper electrode 25, the first dielectric layer 24 and the first lower electrode 232 form a first capacitor 26. As shown in FIG. 25, a first protective layer 27 is formed, so as to encapsulate the first inductor 231 and the first capacitor 26. The first protective layer 27 comprises at least one first opening 271, and the first opening 271 exposes part of the first metal layer 23 or part of the first upper electrode 25. As shown in FIG. 26, at least one first bump 28 is formed in the first opening 271 of the first protective layer 27 and the carrier 29 is removed, and the semiconductor package 2 is made.

Figure 27:
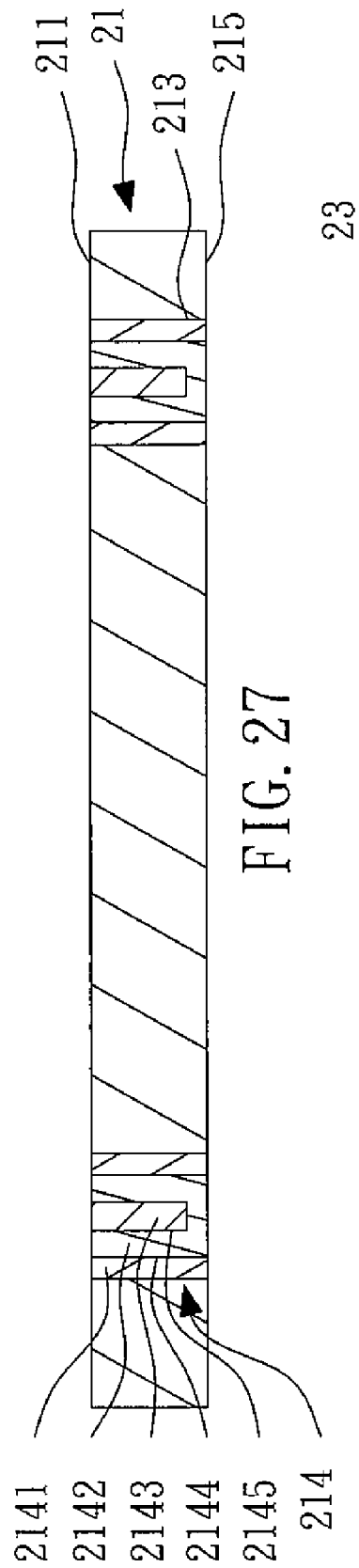
FIGS. 27-29 are schematic views of a method for making a semiconductor package according to a third embodiment of the present invention.
Figure 28:
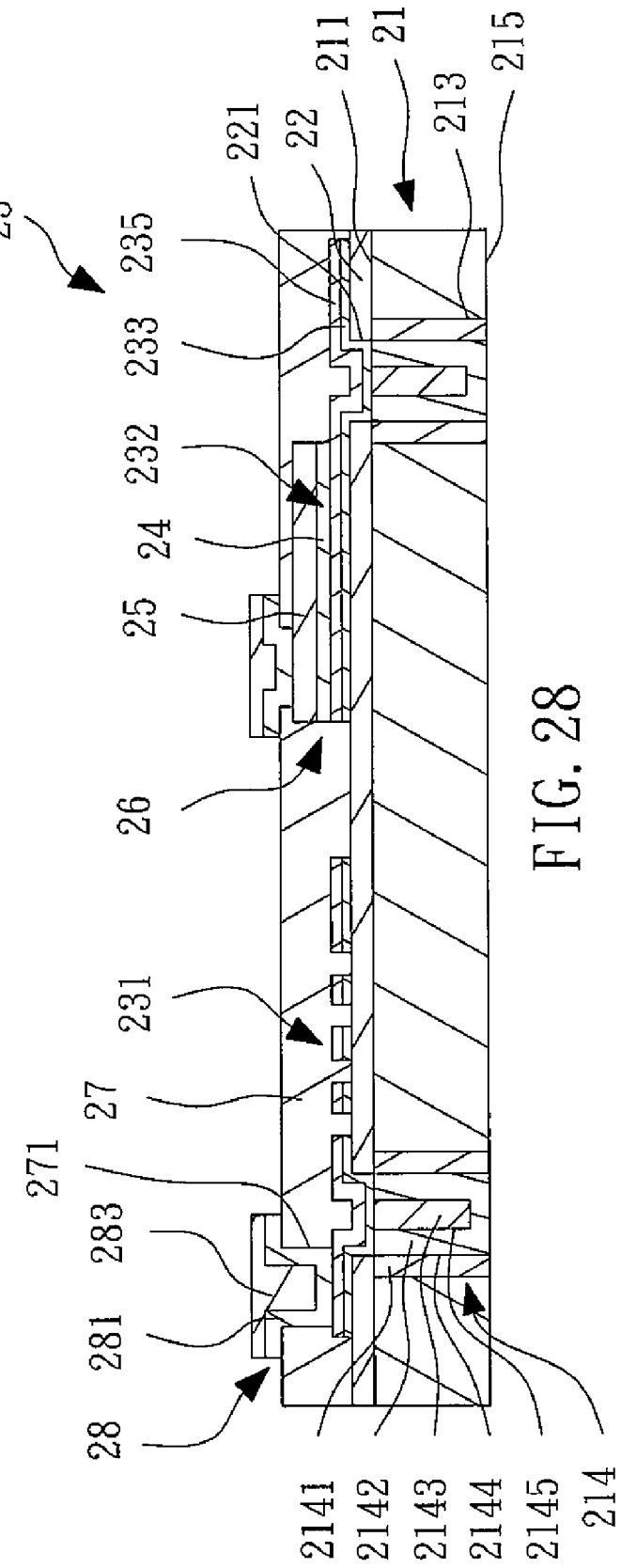
Figure 29:
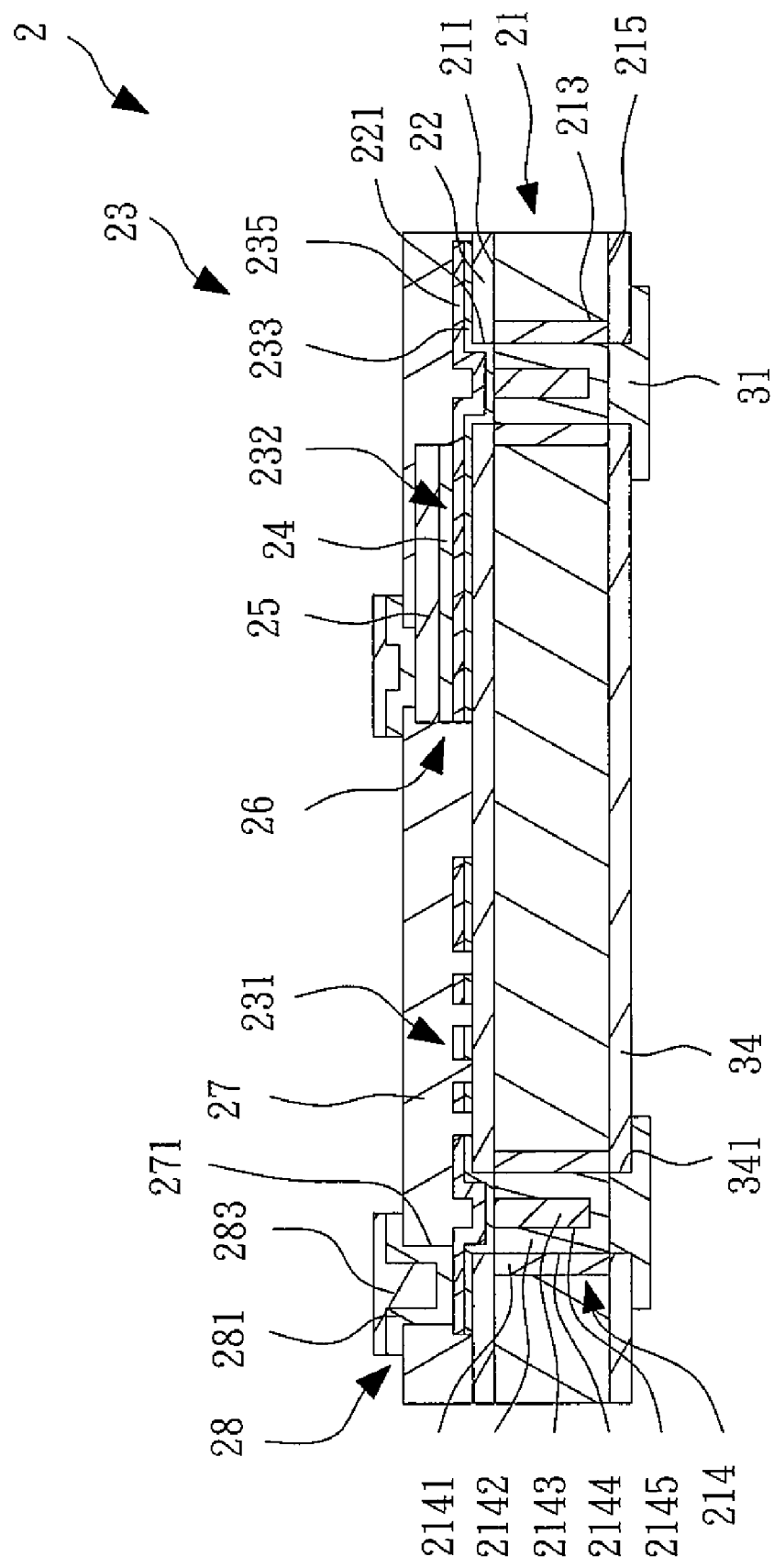

FIGS. 27-29 are schematic views of a method for making a semiconductor package according to a third embodiment of the present invention. The method for making a semiconductor package of the third embodiment is substantially the same as that (FIGS. 2-19) of the first embodiment of the present invention, and the same elements are designated with the same numerals. The difference between the third embodiment and the first embodiment, as shown in FIG. 27, is that the base material 21 having a first surface 211, a second surface 215, at least one outer groove 213 and at least one conductive via structure is provided. The outer groove 213 penetrates the first surface 211 and the second surface 215. The conductive via structure is disposed in the outer groove 213 and exposed on the first surface 211 and the second surface 215, so as to form a through via structure 214. Then, as shown in FIG. 28, firstly, a first inductor 231 and a first capacitor 26 are formed on the first surface 211 of the base material 21. As shown in FIG. 29, secondly, at least one electrical device is formed on the second surface 215 of the base material 21, and the semiconductor package 2 is made. However, in other embodiments, the base material 21 can only comprise a first surface 211 and a second surface 215 but does not comprise the outer groove 213 (FIG. 27) and the through via structure 214 (FIG. 27). Besides, the electrical device can first be formed on the second surface 215 of the base material 21, and then the first inductor 231 and the first capacitor 26 are formed on the first surface 211 of the base material 21.

While embodiments of the present invention have been illustrated and described, various modifications and improvements can be made by those skilled in the art. The embodiments of the present invention are therefore described in an illustrative but not restrictive sense. It is intended that the present invention is not limited to the particular forms illustrated, and that all modifications that maintain the spirit and scope of the present invention are within the scope defined in the appended claims.

What is claimed is:

1. A method for making a semiconductor package, comprising the steps of:
   (a) providing a base material, wherein the base material comprises at least one outer groove and at least one conductive via structure, the conductive via structure is disposed in the outer groove, and the conductive via structure comprises an outer insulation layer disposed on the outer groove and defining a first central groove, a conductor disposed on the first central groove and defining a second central groove, and an inner insulation layer filling the second central groove;
   (b) forming a first metal layer on the base material, wherein the first metal layer comprises a first inductor and a first lower electrode;
   (c) forming a first dielectric layer and a first upper electrode on the first lower electrode, wherein the first dielectric layer is disposed between the first upper electrode and the first lower electrode, and the first upper electrode, the first dielectric layer and the first lower electrode form a first capacitor; and
   (d) forming a first protective layer, so as to encapsulate the first inductor and the first capacitor.

2. A semiconductor package, comprising:
   a base material, having a first surface, and a second surface, at least one outer groove and at least one conductive via structure, wherein the conductive via structure is disposed in the outer groove, and the conductive via structure comprises an outer insulation layer disposed on the outer groove and defining a first central groove, a conductor disposed on the first central groove and defining a second central groove, and an inner insulation layer filling the second central groove;
   a first metal layer, disposed on the first surface of the base material, and including a first inductor and a first lower electrode;
   a first dielectric layer, disposed on the first lower electrode;
   a first upper electrode, disposed on the first dielectric layer, and the first upper electrode, the first dielectric layer and the first lower electrode forming a first capacitor; and
   a first protective layer, encapsulating the first inductor and the first capacitor.

3. The semiconductor package according to claim 2, wherein the base material is made of silicon, germanium, glass or silica.

4. The semiconductor package according to claim 2, further comprising a first passivation layer and a second passivation layer, wherein the first passivation layer is disposed on the first surface of the base material, the second passivation layer is disposed on the second surface of the base material, and the first metal layer is disposed on the first passivation layer.

5. The semiconductor package according to claim 2, wherein the first metal layer directly contacts the through via structure.

6. The semiconductor package according to claim 2, wherein the first dielectric layer is made of tantalum pentoxide ($Ta_2O_5$) and the first upper electrode is made of AlCu.

7. The semiconductor package according to claim 2, wherein the first protective layer comprises at least one first opening, and the first opening exposes part of the first metal layer or part of the first upper electrode.

8. The semiconductor package according to claim 2, further comprising at least one electrical device disposed on the second surface of the base material.

* * * * *